United States Patent
Götz et al.

(10) Patent No.: US 10,840,714 B2
(45) Date of Patent: Nov. 17, 2020

(54) ENERGY STORAGE ELEMENT

(71) Applicant: Dr. Ing. h.c. F. Porsche Aktiengesellschaft, Stuttgart (DE)

(72) Inventors: Stefan Götz, Forstern (DE); Malte Jaensch, Bietigheim-Bissingen (DE); Jan Kacetl, Gemmrigheim (DE); Tomas Kacetl, Gemmrigheim (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 37 days.

(21) Appl. No.: 16/297,994

(22) Filed: Mar. 11, 2019

(65) Prior Publication Data
US 2019/0288536 A1    Sep. 19, 2019

(30) Foreign Application Priority Data
Mar. 19, 2018   (DE) .................... 10 2018 106 309

(51) Int. Cl.
*H02J 7/00* (2006.01)
*H02M 7/00* (2006.01)
(Continued)

(52) U.S. Cl.
CPC ............ *H02J 7/0024* (2013.01); *B60L 15/22* (2013.01); *G01R 19/16542* (2013.01);
(Continued)

(58) Field of Classification Search
CPC . H02J 7/0024; H02J 2007/0067; B60L 15/22; B60L 50/64; B60L 50/66; B60L 50/71; H01M 2010/4271; H01M 10/4257
See application file for complete search history.

(56) References Cited

U.S. PATENT DOCUMENTS 9,496,799 B2    11/2016  Goetz et al.
2008/0205086 A1  8/2008  Darroman et al.
(Continued)

FOREIGN PATENT DOCUMENTS

DE    102010052934 A1    5/2012
DE    102011108920 A1    1/2013
(Continued)

OTHER PUBLICATIONS

Goetz et al., "Modular Multilevel Converter with Series and Parallel Module Connectivity: Topology and Control", IEEE Transactions on Power Electronics, vol. 30, No. 1, Jan. 2015—pp. 203-215.
(Continued)

*Primary Examiner* — Ryan Johnson
(74) *Attorney, Agent, or Firm* — RatnerPrestia

(57) ABSTRACT

An energy storage element for providing a voltage has a first control apparatus and modules, which modules each have an energy storage unit, a connection unit and a module control apparatus. The connection units are connected between two associated modules and have first switches and which connection units are designed to enable, on the basis of the state of the first switches, at least two connections from the group of connections including parallel connection of two modules, serial connection of two modules, bridging of at least one of the two modules which first control apparatus and which module control apparatus are together designed to make it possible to change the control of the associated connection unit during use of the energy storage element in order to reconfigure the energy storage element. The first control apparatus is designed to control the module control apparatuses.

13 Claims, 5 Drawing Sheets

(51) Int. Cl.
  *G01R 31/382*  (2019.01)
  *G01R 19/165*  (2006.01)
  *B60L 15/22*   (2006.01)
  *H01M 10/42*   (2006.01)

(52) U.S. Cl.
  CPC .......... *G01R 31/382* (2019.01); *H02J 7/0031* (2013.01); *H02M 7/003* (2013.01); *H01M 2010/4271* (2013.01); *H02J 2207/20* (2020.01); *Y02T 10/70* (2013.01)

(56) References Cited

U.S. PATENT DOCUMENTS

| | | |
|---|---|---|
| 2009/0033254 A1 | 2/2009 | Nagashima et al. |
| 2018/0212530 A1 | 7/2018 | Götz |
| 2018/0219478 A1 | 8/2018 | Götz |
| 2019/0363311 A1* | 11/2019 | Crowley .............. H02J 7/0024 |

FOREIGN PATENT DOCUMENTS

| | | | |
|---|---|---|---|
| DE | 102014223227 A1 | 5/2015 | |
| DE | 102015112512 A1 | 2/2017 | |
| WO | 2017016674 A1 | 2/2017 | |
| WO | 2017016675 A1 | 2/2017 | |
| WO | WO-2017016674 A1 * | 2/2017 | .......... H02J 2207/20 |

OTHER PUBLICATIONS

Perez et al., "Circuit Topologies, Modeling, Control Schemes, and Applications of Modular Multilevel Converters", IEEE Transactions on Power Electronics, vol. 30, No. 1, Jan. 2015—pp. 4-17.

* cited by examiner

ENERGY STORAGE ELEMENT

CROSS-REFERENCE TO RELATED APPLICATION

This application claims priority to German Patent Application No. DE 10 2018 106 309.1, filed Mar. 19, 2018, which is incorporated by reference herein in its entirety.

FIELD OF THE INVENTION

The invention relates to an energy storage element, in particular an energy storage element having reconfigurable modules.

BACKGROUND OF THE INVENTION

Conventional energy storage elements for vehicles, such as batteries, have modules which are hard-wired to one another. Therefore, the voltage of the battery falls as a result of the discharge, and the maximum capacity of the battery and usually also the voltage when fully charged are reduced over a relatively long time. Battery management systems are used to monitor and regulate rechargeable batteries. In this case, balancers are also used and are designed to discharge the units inside the battery as uniformly as possible. Balancing is usually carried out only at the start or end of the charging operation. When charging the batteries, there are requirements imposed on the voltage, and voltage regulators are possibly required depending on the application. When the vehicle is charged using an AC voltage, AC/DC conversion must be carried out, in which case the AC/DC converter possibly limits the maximum charging power.

US 2008/0205086 A1, which is incorporated by reference herein, shows a vehicle in which a non-stabilized DC voltage source is connected to a low-power AC load via a DC/DC converter and a DC/AC converter. The DC/DC converter is used to stabilize the non-stabilized DC voltage source.

US 2009/0033254 A1, which is incorporated by reference herein, shows an inverter system having two DC voltage sources with fuel cells and an energy exchange method.

SUMMARY OF THE INVENTION

An energy storage element for providing a voltage has a first control apparatus and modules, which modules each have an energy storage unit, a connection unit and a module control apparatus, which connection units are connected between two associated modules and have first switches, and which connection units are designed to enable, on the basis of the state of the first switches, at least two connections from the group of connections including
  (i) parallel connection of two modules,
  (ii) serial connection of two modules, and
  (iii) bridging of at least one of the two modules,
which first control apparatus and which module control apparatus are together designed to make it possible to change the control of the associated connection unit during use of the energy storage element in order to reconfigure the energy storage element, and which first control apparatus is designed to control the module control apparatuses.

Such an energy storage element enables good reconfiguration of the modules, even during use of the energy storage element. It enables compatibility with many different power inverters since the energy storage element can be adapted. It is also advantageous that balancing can be carried out during operation and, as a result, a quick reaction can be effected. With regard to the safety, the connection units can be used to ensure that the energy storage element does not have a high voltage when not in use or in the event of a fault. The electromagnetic interference radiation and the total harmonic distortion (THD) can be reduced by means of the reconfiguration inside the battery. There are advantages even during charging since the battery can be adapted to the charging voltage. Different energy storage units can also be used.

According to one preferred embodiment, the energy storage units each have at least one fuel cell or at least one battery cell. Both cell types enable good energy storage and are well suited to forming modules.

According to one preferred embodiment, the first switches of the connection units, through which the useful current flows, are semiconductor switches, in particular semiconductor switches of the IGBT, IGCT or MOSFET type. Different types of power switches such as IGBT (Insulated-Gate Bipolar Transistor), IGCT (Integrated Gate-Commutated Thyristor) or MOSFET (Metal-Oxide-Semiconductor Field-Effect Transistor) can be used in said energy storage element. The voltages which occur can be kept comparatively low.

According to one preferred embodiment, the first switches of the connection units, through which the useful current flows, are low-voltage semiconductor switches. This saves costs. The energy storage element enables a design without high voltages in the first switches.

According to one preferred embodiment, the energy storage element has two first outputs for providing the voltage of the energy storage element, and the first control apparatus is designed to control the module control apparatuses on the basis of a predefined desired voltage value U_S in order to influence the voltage U of the energy storage element on the basis of the desired voltage value U_S. As a result, the first control apparatus can react if the output voltage of the energy storage element becomes too low or too high and can accordingly reconfigure the modules.

According to one preferred embodiment, the energy storage element has a first measuring apparatus for producing a first measured value U characterizing the voltage between the two first outputs, and the first control apparatus is designed to regulate the first measured value U to the desired voltage value U_S by reconfiguring the connection units. This makes it possible to set the voltage U according to the desired voltage value U_S.

According to one preferred embodiment, the energy storage element has second measuring apparatuses for producing second measured values characterizing the voltage at a respectively associated module, and the first control apparatus is designed to output control signals to the module control apparatuses on the basis of the second measured values in order to reconfigure the connection units. As a result of this voltage information relating to the individual modules, the first control apparatus can adapt the voltage U well by means of reconfiguration by connecting a module having a higher voltage, rather than a module having a lower voltage, in series, for example, and thereby increasing the voltage of the energy storage element.

According to one preferred embodiment, the energy storage element has third measuring apparatuses for producing third measured values characterizing the state of charge at a respectively associated module, and the first control apparatus is designed to output control signals to the module control apparatuses on the basis of the third measured values in order to reconfigure the connection units and to match the state of charge of the modules to one another during charging and discharging. In previous batteries, the worst battery cell determines whether a battery can still be used in the worst-case scenario since the worst battery cell must be protected from a deep discharge, which possibly makes it necessary to disconnect the battery. By means of the energy storage element, such a poor battery cell can be bridged during operation, for example, and can therefore be protected from damage.

According to one preferred embodiment, the first control apparatus is designed to control the module control apparatuses in such a manner that a serial connection of modules connected in parallel is provided, but not a parallel connection of modules connected in series. Modules connected in series have a higher voltage, and a parallel connection of such modules connected in series therefore requires first switches having a high dielectric strength. In contrast, the voltages are lower without the parallel connection of modules connected in series, and it is possible to use first switches in the form of low-voltage switches, in particular low-voltage semiconductor switches, even though the energy storage element may be a high-voltage energy storage element. This is very advantageous.

According to one preferred embodiment, the first control apparatus and the module control apparatus are designed to turn off the first switches in the event of a fault or in the event of disconnection in order to prevent a serial connection of the modules by means of the first connection units. As a result, the energy storage element can be considered to be a low-voltage component in the event of a fault or in the event of disconnection. This increases the safety, for example after an accident. The first switches can therefore be disconnected by the first control apparatus and/or by the module control apparatus. In the case of accidents in particular, it is very advantageous if the presence of high voltages can be excluded.

According to one preferred embodiment, the module control apparatus has an ASIC, an FPGA, a CPLD, a microcontroller, a logic module, an integrated circuit or a discrete logic circuit. These are particularly fast electronic circuits, and this increases the safety since the first switches can also be quickly switched.

According to one preferred embodiment, a vehicle has such an energy storage element. Advantages arise in the case of vehicles since high powers are used and a constant voltage is advantageous.

According to one preferred embodiment, the energy storage element is connected to a power inverter in order to supply the latter with current. The high quality of the energy storage element as a result of the reconfiguration possibility results in the power inverter being able to operate very well.

According to one preferred embodiment, the energy storage element is directly connected to the power inverter without the interposition of a DC/DC converter. This is possible as a result of the good constancy of the voltage, and the saving of the DC/DC converter reduces the power loss and the weight of the vehicle.

BRIEF DESCRIPTION OF THE DRAWING

Further details and advantageous developments of the invention emerge from the exemplary embodiments, which are described below, are illustrated in the drawings and should in no way be understood as a restriction of the invention, and from the subclaims. In the drawings:

DETAILED DESCRIPTION OF THE INVENTION

Figure 1:
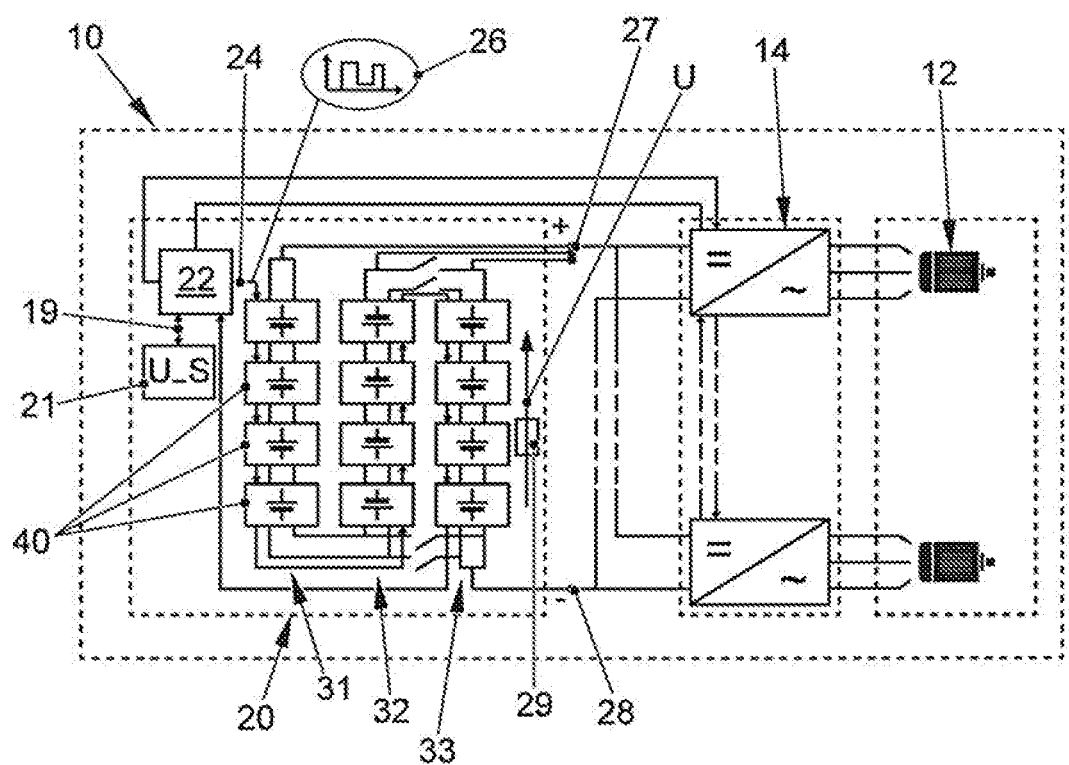
FIG. 1 shows a schematic illustration of a vehicle 10 having an energy storage element 20 and electric motors 12.

FIG. 1 shows a vehicle 10, in particular an electric vehicle or a hybrid vehicle. An energy storage element 20 for providing a voltage is provided and can be electrically connected, by way of example, to associated AC motors 12 via power inverters 14. The energy storage element 20 has a first control apparatus 22 and a plurality of modules 40, which modules 40 can be connected to one another in a reconfigurable manner in order to set the voltage U at the poles 27, 28 of the energy storage element 20. A vehicle control apparatus 21 is provided and is connected to the first control apparatus 22 via a data line 19. The vehicle control apparatus 21 is superordinate to the first control apparatus 22 and can specify a desired voltage value U_S, for example, to the first control apparatus. The first control apparatus 22 is connected to the modules 40 via a data line 24 in order to be able to transmit control signals 26 to the modules 40. The modules 40 can also preferably communicate with one another via the data lines 24 or via an additional data line which is not illustrated. For example, the energy storage element 20 has a first branch 31, a second branch 32 and a third branch 33. The branches 31, 32, 33 may be at least partially connected in series or connected in parallel with one another in order to provide different voltages U at the poles 27, 28 of the energy storage element 20.

As a result of the reconfigurability of the modules 40, the energy storage element 20 shown allows the voltage U, for example, to be adapted to the desired voltage value U_S and, as a result, the voltage U can be increased or reduced in the case of a changing state of charge of the modules 40 by means of the reconfiguration.

Figure 2:
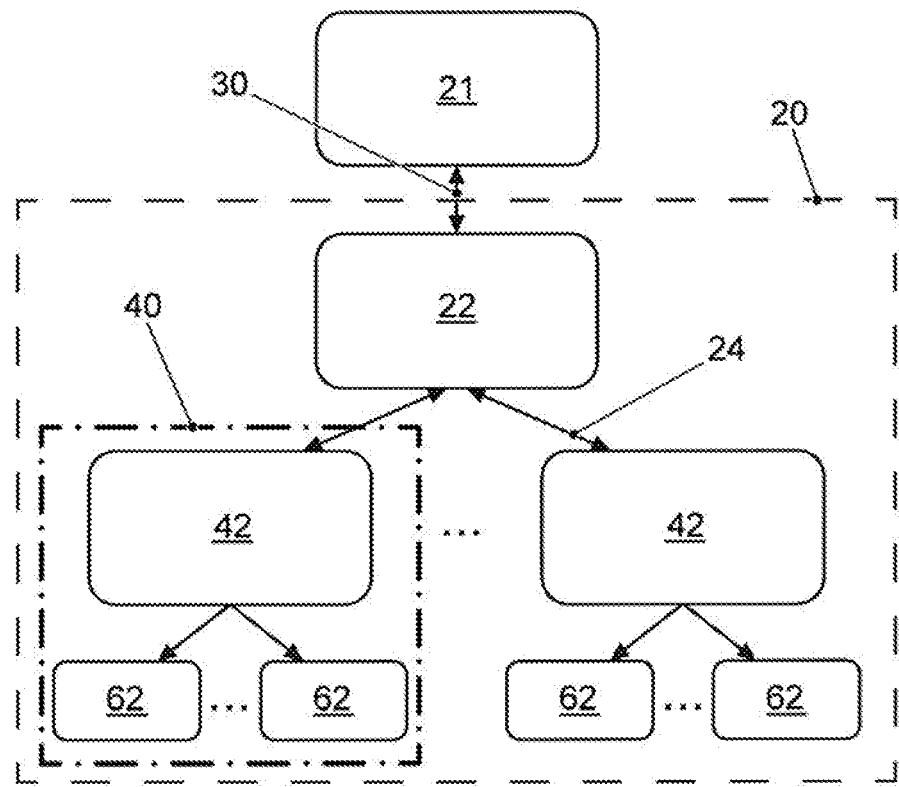
FIG. 2 shows a schematic illustration of a control chain for controlling the energy storage element 20.

FIG. 2 shows the control structure. The vehicle control apparatus 21 is usually arranged outside the energy storage element 20 and communicates with the first control apparatus 22 of the energy storage element 20. The vehicle control apparatus 21 transmits, for example, a desired voltage value signal to the first control apparatus 22, and the first control apparatus 22 transmits, for example, a status and error values of the energy storage element 20. A data line 30, for example a unidirectional or bidirectional bus, is provided between the vehicle control apparatus 21 and the first control apparatus 22. The first control apparatus 22 determines how the modules 40 should be configured and transmits, via the control line 24, corresponding signals to the module control apparatuses 42 which are each associated with one of the modules 40. The control line 24 is preferably a data line, in particular a unidirectional or bidirectional bus. The module control apparatus 42 transmits control signals to first switches 62 which are provided for the purpose of activating or deactivating connections between battery modules 40, wherein a useful current flows via the first switches 62 when the latter are turned on. The module control apparatus 42 preferably monitors the associated module (voltage, state of charge, temperature). The module control apparatus 42 preferably has a communication unit for communicating with the first control apparatus 22 and/or the other modules 40.

The module control apparatus 42 preferably has an ASIC (Application Specific Integrated Circuit), an FPGA (Field Programmable Gate Array), a CPLD (Complex Programmable Logic Device), a microcontroller or other logic circuits, in particular non-programmable logic circuits as well. Non-programmable logic circuits comprise, for example, logic gates such as modules from the group of 74XX chips, for example 7400 logic, or from the 4000 series. The circuits can be in the form of integrated circuits (IC) or discrete circuits comprising individual electronic or electrical components. Different types of logic such as CMOS logic or TTL logic can be used. Simple logic circuits already make it possible to form simple coding and decoding units which receive commands from a control bus, for example, and convert them into the corresponding control signals, for example gate signals of the individual switches. Said circuits preferably also contain memory modules.

Such electronic components enable fast communication and can react very quickly to the application-specific events and can switch the first switches 62. This results in a high degree of safety.

The first control apparatus 22 determines a suitable configuration of the connection units 60 and transmits a corresponding control signal suitable for the associated module 40 to each connection unit 60. The module control apparatus 42 switches the first switches 62 on the basis of this control signal.

Figure 3:
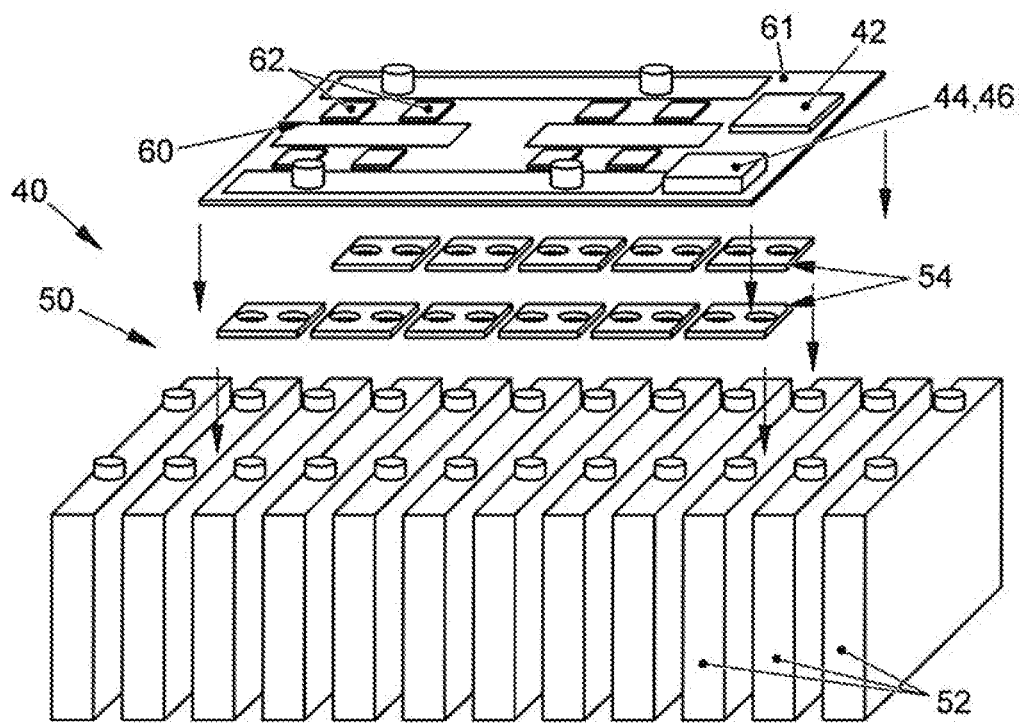
FIG. 3 shows an exploded illustration of a module of the energy storage element.

FIG. 3 shows a module 40. The module 40 has an energy storage unit 50, a connection unit 60 and an associated module control apparatus 42. The connection unit 60 has the first switches 62, and the module 40 can be connected to another module 40 on the basis of the state of the first switches 62. For this purpose, the modules 40 are connected to one another to form the energy storage element 20, with the result that the connection units 60 are connected between two associated modules 40.

The connection unit 60 preferably has a printed circuit board 61 on which the first switches 62 with connection lines 63 and preferably also the module control apparatus 42 are provided.

A second measuring apparatus 44 for producing second measured values characterizing the voltage at the module 40 is preferably provided. More preferably, a third measuring apparatus 46 for producing third measured values characterizing the state of charge at the associated module 40 is provided. The arrangement of said elements on the printed circuit board 61 is preferred, but said elements can also be provided on another printed circuit board or without a printed circuit board.

The first control apparatus 22 from FIG. 2 and the module control apparatus 42 are together designed to make it possible to change the control of the associated connection unit 60 even during use of the energy storage element 20 in order to thus reconfigure the energy storage element 20. In the exemplary embodiment, the energy storage unit 50 is constructed from battery cells 52 which are permanently connected via a connection 54. In the exemplary embodiment, the battery cells 52 are connected in series by means of the connection 54 in order to achieve a predefined basic voltage level. Depending on the basic voltage of the battery cells 52, a parallel connection or a combined serial and parallel connection is also possible. In the battery cells 52, each battery cell 52 has its own energy tank. As an alternative to the battery cells 52, fuel cells which are not illustrated can be used. In the case of fuel cells, it is appropriate to use a shared energy tank with the fuel, in which case the power converters of the fuel cells access the common energy tank. If the battery cells 52 or the fuel cells provide a sufficient voltage, an individual battery cell or fuel cell can also be used as the energy storage unit 50.

Figure 4:
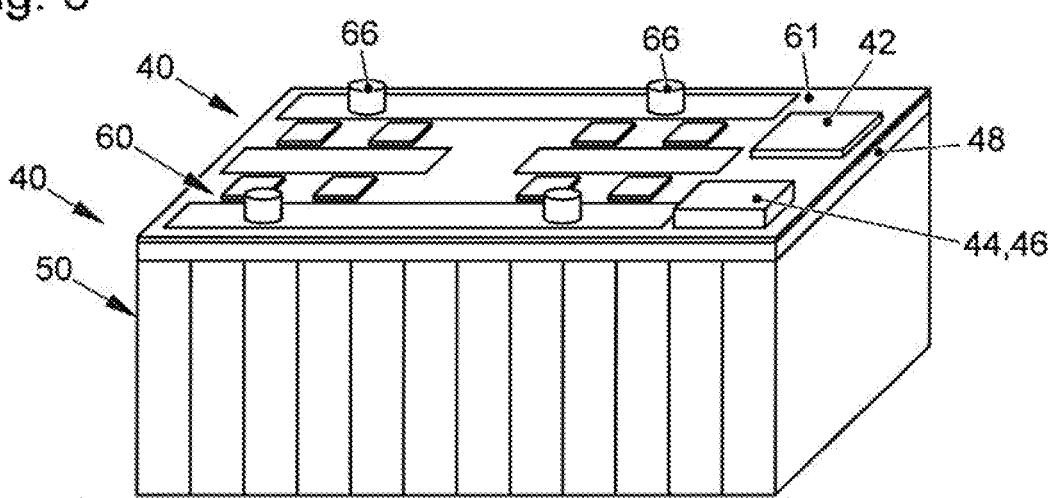
FIG. 4 shows the module from FIG. 3 in the assembled state.

FIG. 4 shows the module 40 in the assembled state. The printed circuit board 61 is permanently connected to the energy storage unit 50, in which case an intermediate plate 48 is provided, by way of example, between the printed circuit board 61 and the energy storage unit 50. The module has terminals 66 in order to enable a connection between adjacent modules 40.

Figure 5:
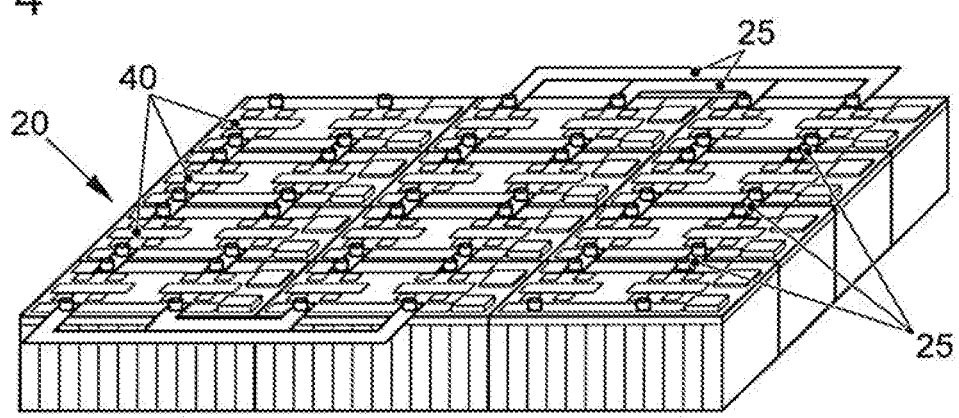
FIG. 5 shows the energy storage element with modules.

FIG. 5 shows an energy storage element 20 having twelve modules 40 which are connected according to the circuit diagram from FIG. 1. The individual modules 40 are connected to adjacent modules via connection lines 25.

Figure 6:
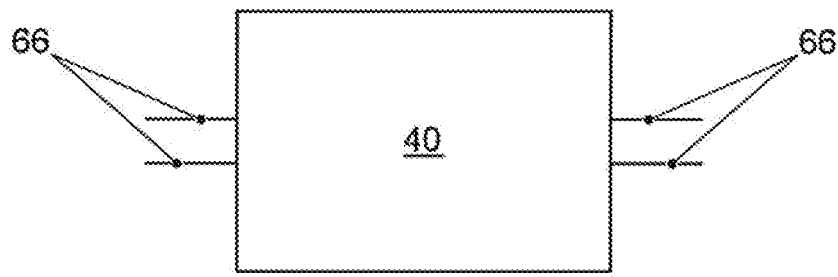
FIG. 6 shows a schematic illustration of the module.

FIG. 6 shows a schematic illustration of a module 40 with the associated terminals 66 which can be used to connect the module 40 to an adjacent module 40 or to one of the poles 27, 28.

Figure 7:
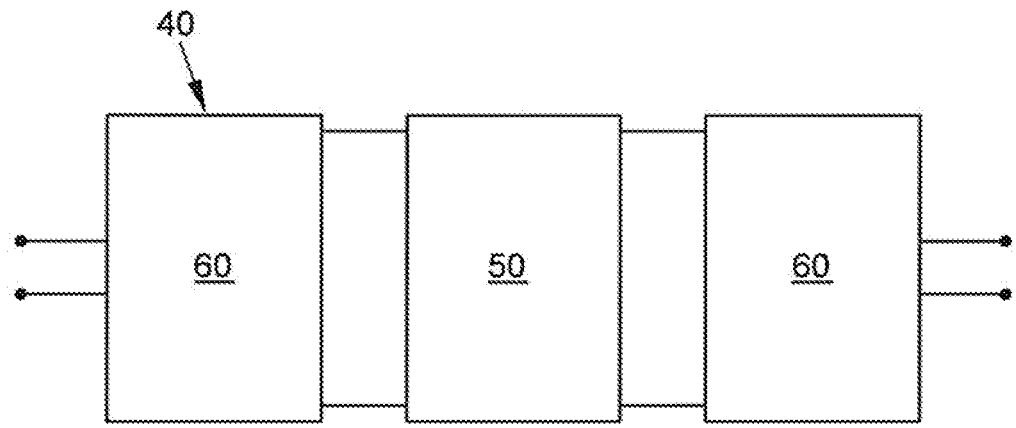
FIG. 7 shows a schematic illustration of a first embodiment of the module from FIG. 6.

FIG. 7 shows a schematic illustration of a first embodiment of the module 40 in which a connection unit 60 is provided on two sides of the energy storage unit 50. As a result, the module 40 can be connected to a further module 40 both to the left and to the right.

Figure 8:
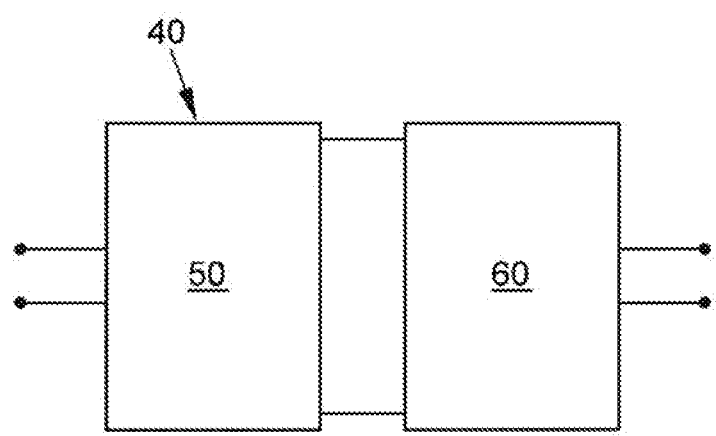
FIG. 8 shows a second embodiment of the module from FIG. 6.

FIG. 8 shows a second embodiment of the module 40 in which a connection unit 60 is provided only on one side of the energy storage unit 50. As a result, the module 40 can be connected to a further module 40 on the right-hand side. A connection to one of the poles 27, 28, for example, can be provided on the left-hand side.

Figure 9:
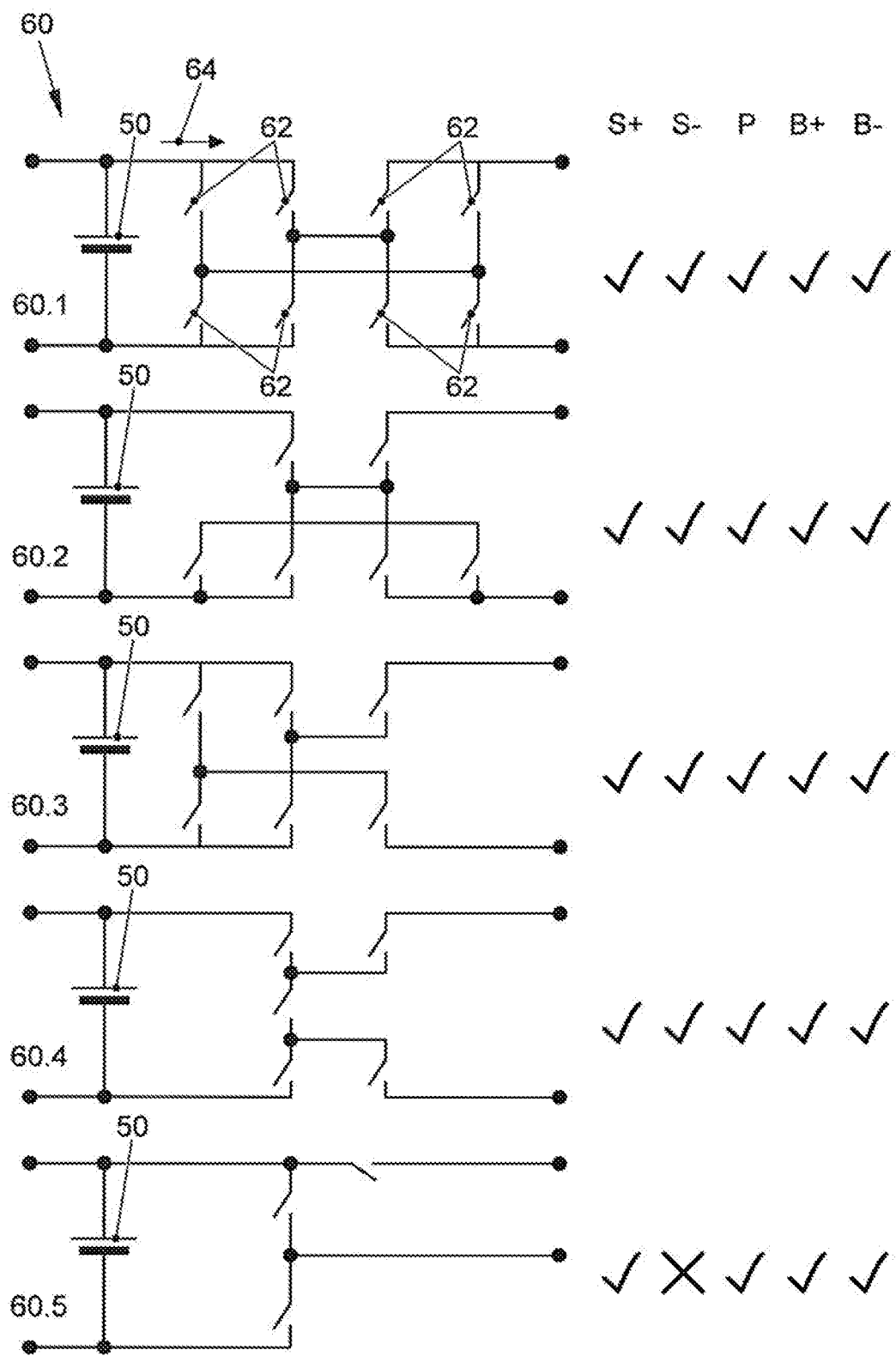
FIG. 9 shows possible connection units for connecting the modules.

FIG. 9 shows different embodiments of the connection unit 60. Reference is also made to micro-topologies. The embodiments are denoted 60.1 to 60.5. The energy storage unit 50 is schematically illustrated in each case, and a possible connection is shown to the right of the energy storage unit, in the case of which connection the useful current 64 can flow via one or more of the first switches 62. The possible connections which can be achieved with the corresponding connection unit are listed on the right-hand side. In this case, S+ denotes a serial positive connection, S− denotes a serial negative connection, P denotes a parallel connection, B+ denotes bridging via the positive busbar and B− denotes bridging via the negative busbar. The connection unit 60.5 does not enable a serial negative connection. Every connection is not required in every embodiment, and one of the possible connections, which has as few first switches 62 as possible for example, can be selected.

Providing the connection units 60 results in high degrees of freedom during the reconfiguration inside the energy storage element 20.

Further micro-topologies are described in

WO 2017/016675 A1, which is incorporated by reference herein,

WO 2017/016674 A1, which is incorporated by reference herein,

DE 10 2011 108 920 A1, which is incorporated by reference herein,

DE 10 2010 052 934 A1, which is incorporated by reference herein,

S. Goetz, A. Peterchev, T. Weyh (2015), Modular multilevel converter with series and parallel module connectivity: topology and control. IEEE Transactions on Power Electronics, vol. 30, no. 1, pages 203-215. doi: 10.1109/TPEL.2014.2310225, M. Perez, S. Bernet, J. Rodriguez, S. Kouro, R. Lizana (2015), Circuit topologies, modelling, control schemes, and applications of modular multilevel converters, which is incorporated by reference herein. IEEE Transactions on Power Electronics, vol. 30, no. 1, pages 4-17. doi: 10.1109/TPEL.2014.2310127, which is incorporated by reference herein.

Figure 10:
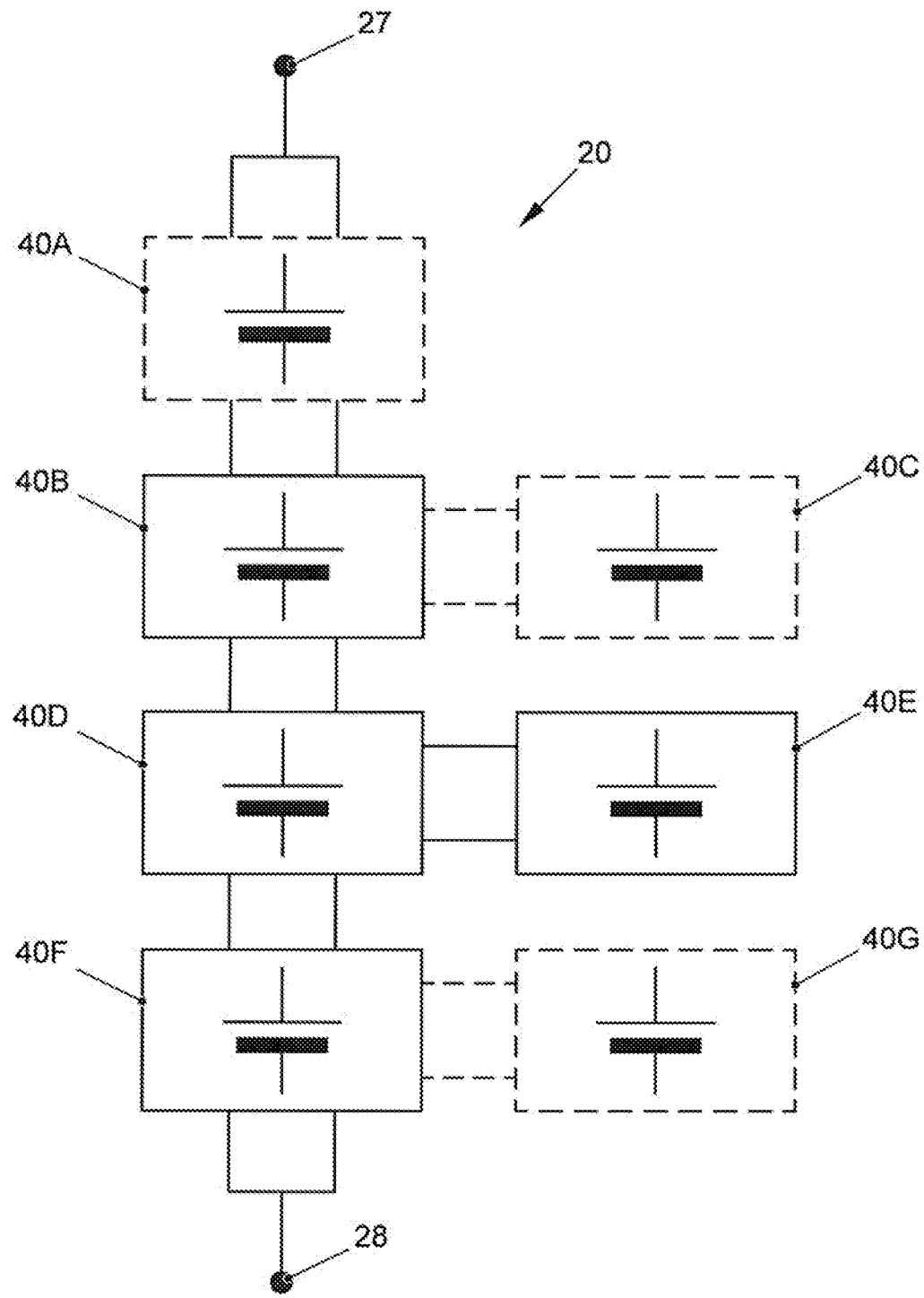
FIG. 10 shows, by way of example, a possible configuration of the modules in the energy storage element.

FIG. 10 shows a possible connection of seven of the modules 40 between the poles 27, 28, as calculated by the first control apparatus 22 and output to the modules 40. The number of modules 40 connected in series determines the voltage between the poles 27, 28. In the configuration shown, the module 40A is bridged and therefore does not contribute to the overall voltage. This may be necessary, for example, if the module 40A is not operating correctly or if a lower overall voltage A is desired at the poles 27, 28. The modules 40B, 40D and 40F are connected in series, and a module 40E is connected in parallel with the module 40D. This may be advantageous, for example, if the module 40D has been discharged to a greater extent than the other modules, and the discharge of the module 40D is reduced by connecting the module 40E. In addition, charge equalization between the modules 40D and 40E can be carried out, and the overall resistance is reduced by the parallel connection. A module 40C can be connected in parallel with the module 40B. However, the parallel connection is deactivated (dashed line). This can be advantageous if the module 40C has been discharged to a greater extent than other modules 40 or if the module 40B has been discharged to a greater extent than the other modules 40 during an operation of charging the energy storage element 20. In the same manner, it is possible to connect the module 40G in parallel with the module 40F, in which case the module 40G is also deactivated. In the exemplary embodiment, the first control apparatus 22 has controlled the modules 40 in such a manner that a serial connection of modules 40 is provided, in which case one or more further modules 40 can or cannot be connected in parallel with the modules 40 connected in series in each case. This type of connection is advantageous in comparison with a parallel connection of modules which are already connected in series since higher voltages occur in the case of such a parallel connection and greater requirements are also imposed on the first switches 62 as a result. The embodiment shown, in which modules 40 which have not already been connected in series are additionally connected in parallel, allows the use of low-voltage semiconductor switches. In the case of such semiconductor switches in vehicles, a person skilled in the art refers to the low-voltage range if a DC voltage is less than 60 V or if the root mean square value of an AC voltage is less than 30 V. The voltage at the energy storage unit 50 to be connected by means of the first switch 61 determines the necessary dielectric strength of the first switch 61.

Numerous variations and modifications are naturally possible within the scope of the invention.

One or more battery cells or fuel cells were respectively proposed as the energy storage unit. However, any voltage source is possible in principle.

Wired data lines were mentioned as data lines. The use of wireless data lines is also possible instead of said wired data lines, either in some or all data lines 30, 24 etc. mentioned.

What is claimed is:

1. An energy storage element for providing a voltage, the energy storage element comprising:
    a first control apparatus;
    modules each having an energy storage unit, a connection unit and a module control apparatus, which connection units are connected between two associated modules and have first switches;
    the connection units are configured to enable, on a basis of a state of the first switches, at least two connections from the group of connections including (i) parallel connection of the two modules, (ii) serial connection of the two modules, and (iii) bridging of at least one of the two modules;
    two first outputs for providing the voltage of the energy storage element, and in which the first control apparatus is configured to control the module control apparatuses on the basis of a predefined desired voltage value in order to influence the voltage of the energy storage element on the basis of a desired voltage value; and
    a first measuring apparatus for producing a first measured value characterizing the voltage between the two first outputs, and wherein the first control apparatus is configured to regulate the first measured value to the desired voltage value by reconfiguring the connection units,
    wherein the first control apparatus and the module control apparatus are together configured to enable changing of a control of the associated connection unit during use of the energy storage element in order to reconfigure the energy storage element; and
    wherein the first control apparatus is configured to control the module control apparatuses.

2. The energy storage element as claimed in claim 1, in which the energy storage units each have at least one fuel cell or at least one battery cell.

3. The energy storage element as claimed in claim 1, in which the first switches, through which a useful current flows, are semiconductor switches.

4. The energy storage element as claimed in claim 3, in which the first switches are switches of the IGBT, IGCT or MOSFET type.

5. The energy storage element as claimed in claim 3, in which the first switches, through which the useful current flows, are low-voltage semiconductor switches.

6. The energy storage element as claimed in claim 1, further comprising a second measuring apparatuses for producing second measured values characterizing the voltage at a respectively associated module, and wherein the first control apparatus is configured to output control signals to the module control apparatuses on the basis of the second measured values in order to reconfigure the connection units.

7. The energy storage element as claimed in claim 6, which has third measuring apparatuses for producing third measured values characterizing the state of charge at a respectively associated module, and wherein the first control apparatus is configured to output control signals to the module control apparatuses on the basis of the third measured values in order to reconfigure the connection units and to match a state of charge of the modules to one another during charging and discharging.

8. The energy storage element as claimed in claim 1, in which the first control apparatus is configured to control the module control apparatuses in such a manner that a serial connection of modules connected in parallel is provided, but not a parallel connection of modules connected in series.

9. The energy storage element as claimed in claim 1, in which the first control apparatus and the module control apparatus are configured to deactivate the first switches in an event of a fault or in an event of disconnection in order to prevent a serial connection of the modules by the first connection units.

10. The energy storage element as claimed in claim 1, in which the module control apparatus has an ASIC, an FPGA, a CPLD, a microcontroller, a logic module, an integrated circuit or a discrete logic circuit.

11. A vehicle having the energy storage element as claimed in claim 1.

12. The vehicle as claimed in claim 11, in which the energy storage element is connected to a power inverter in order to supply the power inverter with current.

13. The vehicle as claimed in claim 12, wherein the energy storage element is directly connected to the power inverter without the interposition of a DC/DC converter.

* * * * *